United States Patent
Schets et al.

(10) Patent No.: US 7,288,779 B2
(45) Date of Patent: Oct. 30, 2007

(54) METHOD FOR POSITION DETERMINATION, METHOD FOR OVERLAY OPTIMIZATION, AND LITHOGRAPHIC PROJECTION APPARATUS

(75) Inventors: Sicco Ian Schets, Eindhoven (NL); Jeroen Huijbregstse, Breda (NL); Allan Reuben Dunbar, London (GB); Nicolaas Petrus Van Der Aa, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 168 days.

(21) Appl. No.: 10/736,911

(22) Filed: Dec. 17, 2003

(65) Prior Publication Data

US 2005/0133743 A1 Jun. 23, 2005

(51) Int. Cl.
*G01N 21/86* (2006.01)

(52) U.S. Cl. .................... 250/559.3; 250/548

(58) Field of Classification Search ............ 250/559.3, 250/559.33, 559.44, 559.4, 548
See application file for complete search history.

(56) References Cited

U.S. PATENT DOCUMENTS

| | | | |
|---|---|---|---|
| 4,251,160 A | 2/1981 | Bouwhuis et al. ........ 356/401 |
| 5,229,872 A | 7/1993 | Mumola ................... 359/40 |
| 5,296,891 A | 3/1994 | Vogt et al. ............... 355/67 |
| 5,523,193 A | 6/1996 | Nelson ................. 430/311 |
| 5,760,411 A * | 6/1998 | Kawakubo .............. 250/548 |
| 5,969,441 A | 10/1999 | Loopstra et al. ......... 310/12 |
| 6,046,792 A | 4/2000 | Van Der Werf et al. ..... 355/53 |
| 6,297,876 B1 | 10/2001 | Bornebroek ............. 355/67 |
| 6,433,352 B1 * | 8/2002 | Oka ..................... 250/559.3 |

FOREIGN PATENT DOCUMENTS

| | | |
|---|---|---|
| WO | 97/35234 | 9/1997 |
| WO | 98/33096 | 7/1998 |
| WO | 98/38597 | 9/1998 |
| WO | 98/40791 | 9/1998 |

* cited by examiner

*Primary Examiner*—Thanh X. Luu
*Assistant Examiner*—Kevin Wyatt
(74) *Attorney, Agent, or Firm*—Pillsbury Winthrop Shaw Pittman LLP

(57) ABSTRACT

A method for optimizing an alignment condition of a lithographic projection apparatus. This method comprises projecting a beam of radiation on a target portion of a substrate and measuring a plurality of diffracted signals emitted by the target portion. This method further comprises calculating a variance for each of the plurality of diffracted signals, such that a plurality of variances of the diffracted signals is determined, and adjusting the alignment condition of the lithographic projection apparatus based on analysis of the plurality of variances.

31 Claims, 5 Drawing Sheets

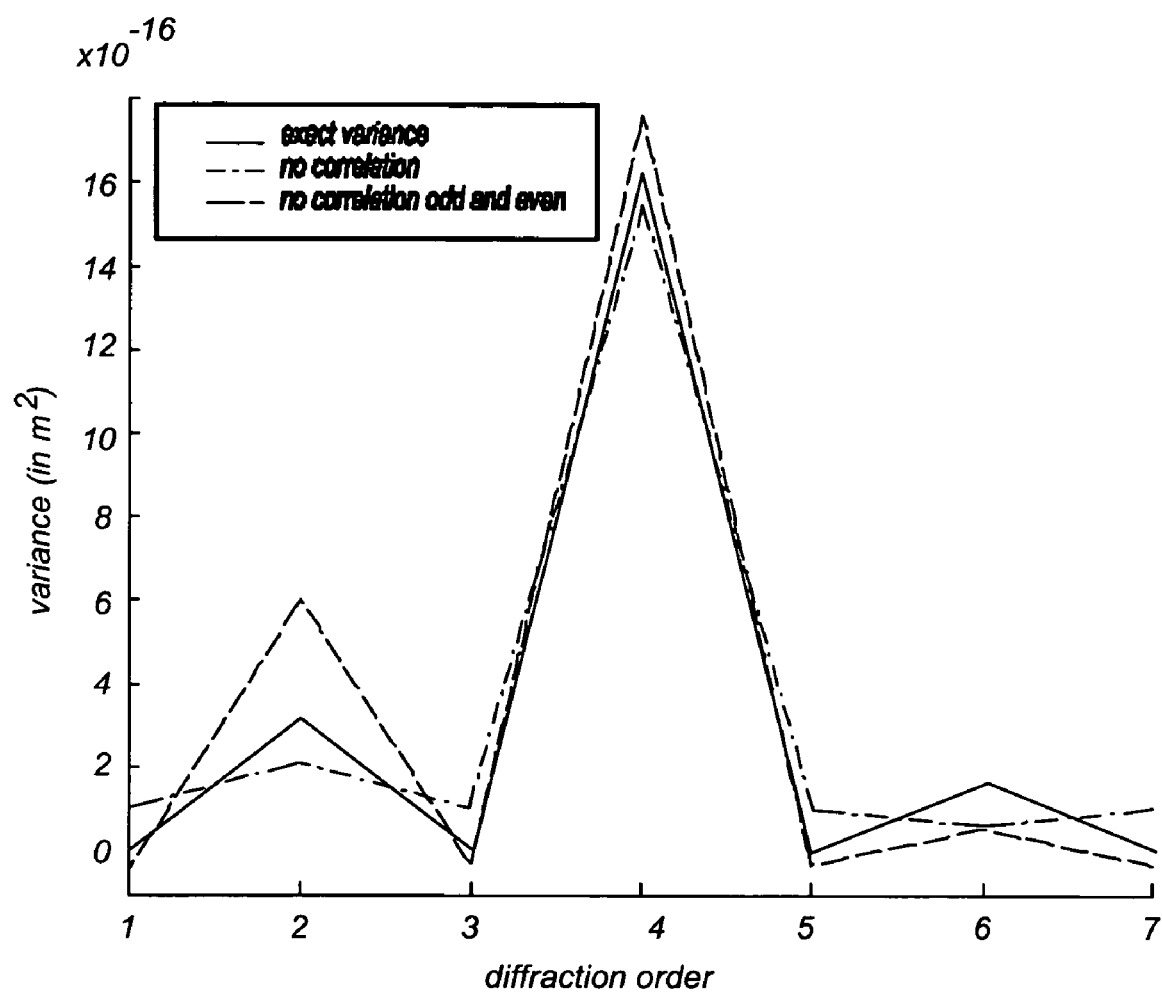

METHOD FOR POSITION DETERMINATION, METHOD FOR OVERLAY OPTIMIZATION, AND LITHOGRAPHIC PROJECTION APPARATUS

FIELD OF THE INVENTION

The present invention relates to lithographic projection apparatus and methods.

BACKGROUND

The term "patterning structure" as here employed should be broadly interpreted as referring to any structure or field that may be used to endow an incoming radiation beam with a patterned cross-section, corresponding to a pattern that is to be created in a target portion of a substrate; the term "light valve" can also be used in this context. It should be appreciated that the pattern "displayed" on the patterning structure may differ substantially from the pattern eventually transferred to e.g. a substrate or layer thereof (e.g. where pre-biasing of features, optical proximity correction features, phase and/or polarization variation techniques, and/or multiple exposure techniques are used). Generally, such a pattern will correspond to a particular functional layer in a device being created in the target portion, such as an integrated circuit or other device (see below). A patterning structure may be reflective and/or transmissive. Examples of patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An array of grating light valves (GLVs) may also be used in a corresponding manner, where each GLV may include a plurality of reflective ribbons that can be deformed relative to one another (e.g. by application of an electric potential) to form a grating that reflects incident light as diffracted light. A further alternative embodiment of a programmable mirror array employs a matrix arrangement of very small (possibly microscopic) mirrors, each of which can be individually tilted about an axis by applying a suitable localized electric field, or by employing piezoelectric actuation means. For example, the mirrors may be matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning structure can comprise one or more programmable mirror arrays. More information on mirror arrays as here referred to can be gleaned, for example, from U.S. Pat. No. 5,296,891 and U.S. Pat. No. 5,523,193 and PCT patent applications WO 98/38597 and WO 98/33096, which documents are incorporated herein by reference. In the case of a programmable mirror array, the support structure may be embodied as a frame or table, for example, which may be fixed or movable as required.

A programmable LCD panel. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask (or "reticle") and mask table (or "reticle table"); however, the general principles discussed in such instances should be seen in the broader context of the patterning structure as hereabove set forth.

A lithographic apparatus may be used to apply a desired pattern onto a surface (e.g. a target portion of a substrate). Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies and/or portion(s) thereof) on a substrate (e.g. a wafer of silicon or other semiconductor material) that has been coated with a layer of radiation-sensitive material (e.g. resist). In general, a single wafer will contain a whole matrix or network of adjacent target portions that are successively irradiated via the projection system (e.g. one at a time).

Among current apparatus that employ patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. A projection beam in a scanning type of apparatus may have the form of a slit with a slit width in the scanning direction. More information with regard to lithographic devices as here described can be gleaned, for example, from U.S. Pat. No. 6,046,792, which is incorporated herein by reference.

In a manufacturing process using a lithographic projection apparatus, a pattern (e.g. in a mask) is imaged onto a substrate that is at least partially covered by a layer of radiation-sensitive material (e.g. resist). Prior to this imaging procedure, the substrate may undergo various other procedures such as priming, resist coating, and/or a soft bake. After exposure, the substrate may be subjected to other procedures such as a post-exposure bake (PEB), development, a hard bake, and/or measurement/inspection of the imaged features. This set of procedures may be used as a basis to pattern an individual layer of a device (e.g. an IC). For example, these transfer procedures may result in a patterned layer of resist on the substrate. One or more pattern processes may follow, such as deposition, (dry) etching, ion-implantation (doping), metallization, oxidation, chemo-mechanical polishing, annealing, etc., all of which may be intended to create, modify, or finish an individual layer (e.g., to build circuit elements such as transistors, resistors, capacitors, etc.).

If several layers are required, then the whole procedure, or a variant thereof, may be repeated for each new layer. Eventually, an array of devices will be present on the substrate (wafer). These devices are then separated from one another by a technique such as dicing or sawing, whence the individual devices can be mounted on a carrier, connected to pins, etc. Due to the sequence of these various processing steps in alternation with lithographic processing steps, it may be desirable for the alignment of subsequent lithographic processing steps to be as accurate as possible, e.g., in order to create the aforementioned circuit elements. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

A substrate as referred to herein may be processed before or after exposure: for example, in a track (a tool that typically applies a layer of resist to a substrate and develops the exposed resist) or a metrology or inspection tool. Where applicable, the disclosure herein may be applied to such and other substrate processing tools. Further, the substrate may be processed more than once (for example, in order to create a multi-layer IC), so that the term substrate as used herein may also refer to a substrate that already contains multiple processed layers.

The term "projection system" should be broadly interpreted as encompassing various types of projection system, including refractive optics, reflective optics, and catadioptric systems, for example. A particular projection system may be selected based on factors such as a type of exposure radiation used, any immersion fluid(s) or gas-filled areas in the exposure path, whether a vacuum is used in all or part of the exposure path, etc. For the sake of simplicity, the projection system may hereinafter be referred to as the "lens." The radiation system may also include components operating according to any of these design types for directing, shaping, reducing, enlarging, patterning, and/or otherwise controlling the projection beam of radiation, and such components may also be referred to below, collectively or singularly, as a "lens."

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT Application No. WO 98/40791, which documents are incorporated herein by reference.

The lithographic apparatus may also be of a type wherein the substrate is immersed in a liquid having a relatively high refractive index (e.g. water) so as to fill a space between the final element of the projection system and the substrate. Immersion liquids may also be applied to other spaces in the lithographic apparatus, for example, between the mask and the first element of the projection system. The use of immersion techniques to increase the effective numerical aperture of projection systems is well known in the art.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm), as well as particle beams (such as ion or electron beams).

Although specific reference may be made in this text to the use of lithographic apparatus in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, DNA analysis devices, etc. The skilled artisan will appreciate that, in the context of such alternative applications, any use of the terms "wafer" or "die" in this text should be considered as being replaced by the more general terms "substrate" and "target portion", respectively.

SUMMARY

A method of position determination according to one embodiment of the invention includes obtaining a plurality of signals based on light affected by an alignment feature of a substrate; determining a variance for each of the plurality of signals; and selecting at least one from among the plurality of signals based on a result of said determining a variance. Apparatus that may be used to obtain such results, device manufacturing methods, and data storage media including instructions describing such methods are also disclosed.

A method for optimizing an alignment condition of a lithographic projection apparatus according to a further embodiment of the invention includes projecting a beam of radiation on a target portion of a substrate, measuring a plurality of diffracted signals emitted by the target portion, and calculating a variance for each of the plurality of diffracted signals, such that a plurality of variances of the diffracted signals is determined, and adjusting the alignment condition of the lithographic projection apparatus based on analysis of the plurality of variances.

A lithographic projection apparatus according to a further embodiment of the invention includes a radiation system configured to provide a projection beam of radiation; a patterning structure configured to pattern the projection beam according to a desired pattern; a support table configured to hold a substrate; a projection system configured to project the patterned beam onto a target portion of the substrate; an alignment projection system configured to project an alignment beam onto the target portion of the substrate; a detection system configured to detect a plurality of diffracted signals emitted by the target portion; a computer system having a processor configured to calculate a variance for each of the plurality of diffracted signals and to determine an optimized alignment of the lithographic projection apparatus based on analysis of a plurality of variances; and an alignment control system configured to adjust the alignment of the lithographic projection apparatus in accordance with the optimized condition determined by the processor.

A machine readable medium according to a further embodiment of the invention is encoded with machine executable instructions for optimizing an alignment condition of a lithographic projection apparatus according to a method comprising projecting a beam of radiation on a target portion of a substrate; measuring a plurality of diffracted signals emitted by the target portion; calculating a variance for each of the plurality of diffracted signals, such that a plurality of variances of the diffracted signals is determined; and adjusting the alignment condition of the lithographic projection apparatus based on analysis of the plurality of variances.

BRIEF DESCRIPTION OF THE DRAWINGS

Embodiments of the invention will now be described, by way of example only, with reference to the accompanying schematic drawings in which:

FIG. 5 shows the effect on the variance, when one takes into account the covariances in a selection process for a most robust and/or stable position value of a semiconductor wafer. In FIG. 5, the variances are determined for a symmetric marker structure using a method according to an embodiment of the present invention.

In the Figures, corresponding reference symbols indicate corresponding parts.

DETAILED DESCRIPTION

Embodiments of the invention include, for example, methods and systems which may be used to improve or optimize an alignment condition of a lithographic projection apparatus. For example, some such embodiments may be used to obtain information on alignment and overlay quality from production-related measurements in such a way that from these measurements a most probable target position can be determined for a target which is influenced by process-induced damage.

Figure 1:
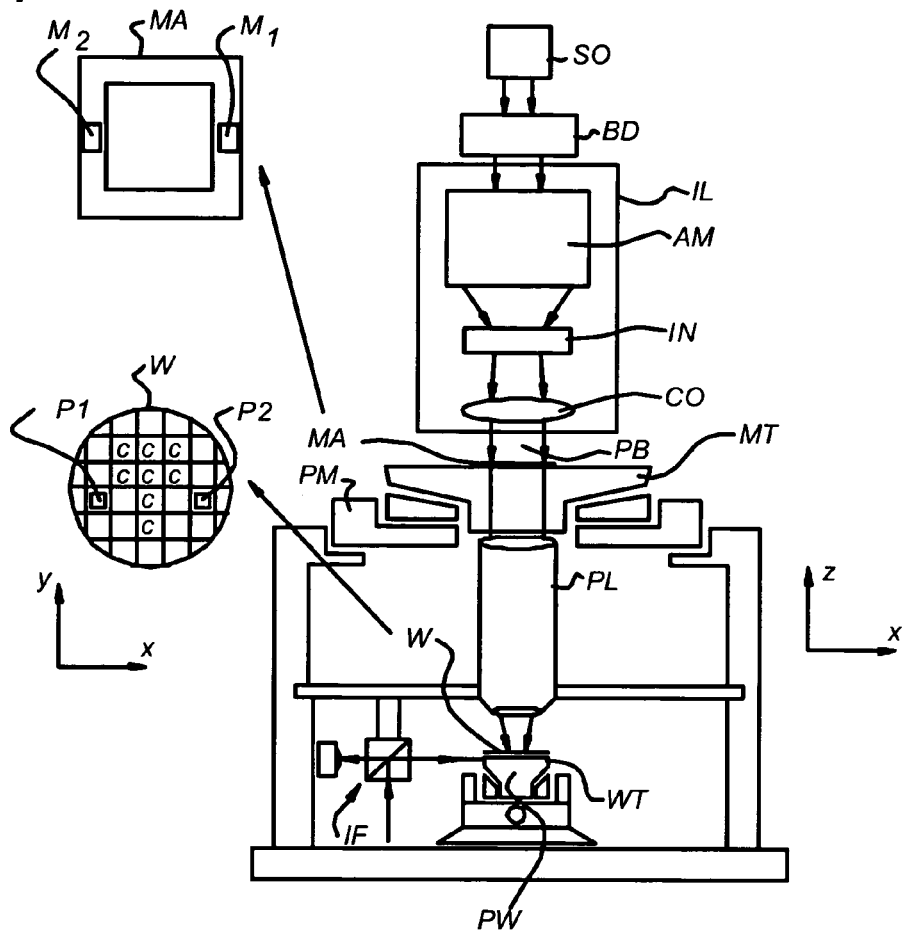
FIG. 1 depicts a lithographic apparatus according to an embodiment of the invention.

FIG. 1 schematically depicts a lithographic projection apparatus according to a particular embodiment of the invention. The apparatus comprises:

A radiation system configured to supply (e.g. having structure capable of supplying) a projection beam of radiation (e.g. UV or EUV radiation). In this particular example, the radiation system RS comprises a radiation source SO, a beam delivery system BD, and an illumination system IL including adjusting structure AM for setting an illumination node, an integrator IN, and condensing optics CO;

A support structure configured to support a patterning structure capable of patterning the projection beam. In this example, a first object table (mask table) MT is provided with a mask holder for holding a mask MA (e.g. a reticle), and is connected to a first positioning structure PM for accurately positioning the mask with respect to item PL;

A second object table (substrate table) configured to hold a substrate. In this example, substrate table WT is provided with a substrate holder for holding a substrate W (e.g. a resist-coated semiconductor wafer), and is connected to a second positioning structure PW for accurately positioning the substrate with respect to item PL and (e.g. interferometric) measurement structure IF, which is configured to accurately indicate the position of the substrate and/or substrate table with respect to lens PL; and A projection system ("lens") configured to project the patterned beam. In this example, projection system PL (e.g. a refractive lens group, a catadioptric or catoptric system, and/or a mirror system) is configured to image an irradiated portion of the mask MA onto a target portion C (e.g. comprising one or more dies and/or portion(s) thereof) of the substrate W. Alternatively, the projection system may project images of secondary sources for which the elements of a programmable patterning structure may act as shutters. The projection system may also include a microlens array (MLA), e.g. to form the secondary sources and to project microspots onto the substrate.

As here depicted, the apparatus is of a transmissive type (e.g. has a transmissive mask). However, in general, it may also be of a reflective type, for example (e.g. with a reflective mask). Alternatively, the apparatus may employ another kind of patterning structure, such as a programmable mirror array of a type as referred to above.

The source SO (e.g. a mercury lamp, an excimer laser, an electron gun, a laser-produced plasma source or discharge plasma source, or an undulator provided around the path of an electron beam in a storage ring or synchrotron) produces a beam of radiation. This beam is fed into an illumination system (illuminator) IL, either directly or after having traversed a conditioning structure or field. A beam delivery system BD, for example, may include suitable directing mirrors and/or a beam expander. The illuminator IL may comprise an adjusting structure or field AM for setting the outer and/or inner radial extent (commonly referred to as σ-outer and σ-inner, respectively) of the intensity distribution in the beam, which may affect the angular distribution of the radiation energy delivered by the projection beam at, for example, the substrate. In addition, the apparatus will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable direction mirrors); this latter scenario is often the case when the source LA is an excimer laser. The current invention and claims encompass both of these scenarios.

The beam PB subsequently intercepts the mask MA, which is held on a mask table MT. Having traversed (alternatively, having been selectively reflected by) the mask MA, the beam PB passes through the lens PL, which focuses the beam PB onto a target portion C of the substrate W. With the aid of the second positioning structure PW (and interferometric measuring structure IF), the substrate table WT can be moved accurately, e.g. so as to position different target portions C in the path of the beam PB. Similarly, the first positioning structure PM (and possibly another position sensor) can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in several different modes:

1. In step mode, the mask table MT is kept essentially stationary, and an entire mask image is projected at once (i.e. in a single "flash") onto a target portion C. The substrate table WT is then shifted in the x and/or y directions so that a different target portion C can be irradiated by the beam PB. In step mode, the maximum size of the exposure field may limit the size of the target portion C imaged in a single static exposure;

2. In scan mode, essentially the same scenario applies, except that a given target portion C is not exposed in a single "flash." Instead, the mask table MT is movable in a given direction (the so-called "scan direction", e.g. the y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). The velocity and direction of the substrate table WT relative to the mask table MIT may be determined by the magnification demagnification and/or image reversal characteristics of the projection system PL. In this manner, a relatively large target portion C can be exposed, without having to compromise on resolution. In scan mode, the maximum size of the exposure field may limit the width (in the non-scanning direction) of the target portion in a single dynamic exposure, whereas the length of the scanning motion may determine the height (in the scanning direction) of the target portion;

3. In another mode, the mask table MT is kept essentially stationary holding a programmable patterning structure, and the substrate table WT is moved or scanned while a pattern imparted to the projection beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations of and/or variations on the above-described modes of use or entirely different modes of use may also be employed.

Alignment and overlay quality may be measured on a semiconductor wafer by means of alignment/overlay features (or targets), e.g., small target structures located on various places on the wafer, of which an optical response is measured. Typically, such an alignment/overlay target comprises a grating, of which a diffraction pattern, generated by an impinging optical beam, is measured. From the diffraction pattern, the position of the alignment/overlay targets may be determined. The position may be used to indicate information on alignment of the wafer relative to the lithographic projection apparatus and/or overlay of patterns in different layer levels on the semiconductor wafer.

Disadvantageously, however, the various processing steps to which a semiconductor wafer and the alignment/overlay targets located on it are subjected may induce some deformation on the target's grating and other structural parts.

Due to processing-induced deformation of the target structure, the optical response of the target structure may change and/or deteriorate. This effect may adversely affect the accuracy of determining a position for this target.

Typically, damage of a target structure due to processing steps as described above may relate to a position error in the order of nanometers. For the newer generations of circuits, the overlay error may be of substantially the same order as the magnitude of the process-induced imaging error.

Such a problem may be overcome by creating a fresh target structure at a given stage of the processing sequence and starting from this fresh target for further measurement. However, this approach may not be efficient, since the available wafer estate for creating new targets is very limited. Moreover, a processing operation for creating new target structures may not be compatible with a processing operation for creating the circuit elements due to, for example, a size effect (e.g. the feature size for a target structure may be much larger than the feature size for a circuit element). In such a case, it may be desirable or necessary to perform an additional manufacturing operation to create fresh target structures.

It is known to obtain a target structure which is not affected during a processing operation, e.g. by introducing additional processing operations to isolate this target structure from a process operation which may introduce damage to the target. However, such a solution may require additional lithographic operations and/or processing time per wafer, which may add to the manufacturing costs.

Conventionally, the measurement of a target position may be performed by measuring the optical response of a single signal in the diffraction pattern of that target structure. From the computed result of this single signal, a position can be determined and a possible error can be corrected. In this one-signal approach, it may be desirable to know the influence of one or more processing operations on the quality of a measured target structure in order to obtain a relatively meaningful result for the position. As a result, it may be desirable to perform tests on sample wafers (short-loop wafers) in processing tools and to characterize the quality of the target structure after such operations. In this way, a kind of calibration of the target quality for each processing operation and its influence on the position of the target may be obtained.

Such an approach may possibly be elaborate, due to a potentially large number of experiments. It follows that processing tools may be withdrawn from the available production resources, and production may be slowed down. Moreover, for some processing tools, a change of processing parameters may have a relatively large effect on target quality and on the determination of a position from it. In such a case, when a process operation is modified, a new characterization for that operation may be desirable.

While ignoring such potential disadvantages, an ideal situation might be when a direct measurement of one signal on production wafers would suffice to obtain any required overlay data measurements. Then, an optimal characterization of the most probable target position may be derived from these one signal data. However, the process-induced position error (e.g. on the order of nanometers) is generally relatively small in comparison to the alignment variation caused by wafer handling in a lithographic projection apparatus, which may be on the order of a few microns. As a result, the desired data on position error may not be obtained by (direct) measurement of a single signal obtained on a production wafer.

The alignment or overlay in the lithographic projection apparatus is typically determined by an optical alignment sensor system. An example of a wafer alignment system based on gratings using a Keplerian telescope is shown in U.S. Pat. No. 4,251,160. This reference discloses a wafer alignment system, comprising a Keplerian telescope for imaging diffracted beams, generated by a grating, on one or more detectors to obtain information on the alignment of a wafer relative to a reference.

PCT Patent Publication WO97/35234 discloses a wafer alignment system having a diaphragm which comprises a plurality of pinholes which are located at predetermined positions in the plane of intermediate focus where the focus of each diffraction order is expected in the ideal case of an untilted grating. This arrangement is used for spatial filtering of the diffraction orders to obtain information from each individual order.

U.S. Pat. No. 6,297,876 relates to a lithographic apparatus with an alignment system for aligning a substrate and mask and is incorporated herein by reference.

In such a wafer alignment system, comprising a grating as the marker, multiple diffracted beams (diffraction orders) and/or multiple colors may be used for detection. When multiple diffraction orders and/or colors are measured simultaneously, marker roughness may result in order-to-order and/or color-to-color differences, respectively, in measured positions of the images, thereby degrading performance of the alignment procedure.

Figure 2:
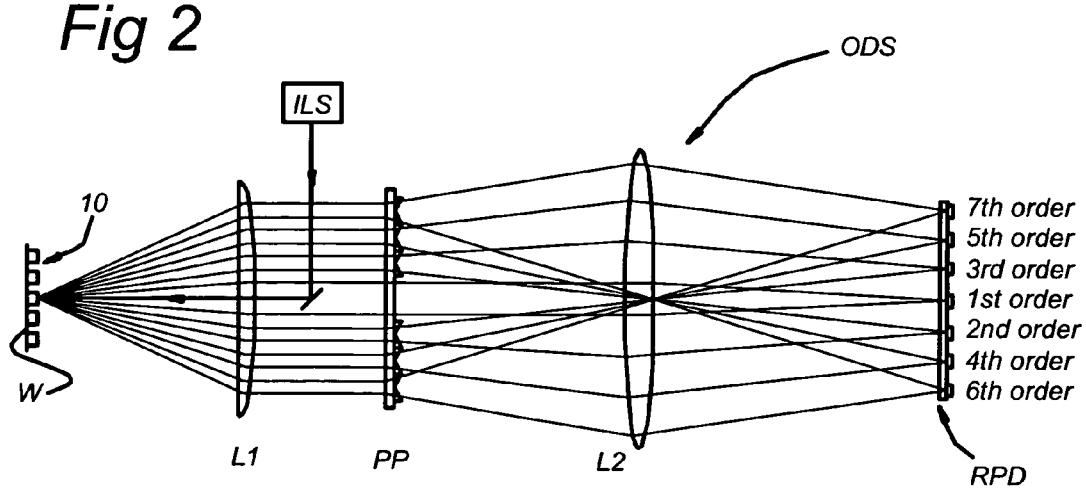
FIG. 2 shows a schematic representation of an optical measurement principle of a detection system to measure multiple diffraction orders, according to an embodiment of the invention.

FIG. 2 shows a schematic representation of an optical measurement principle of a detection system to measure multiple diffraction orders.

The alignment or overlay in a lithographic projection apparatus may be measured by determining a location of a marker 10 with a well-known position on the substrate W. Typically, such a measurement may be done by an optical detection system ODS. In FIG. 2, the marker 10 corresponds to a grating formed on the semiconductor substrate W.

The optical detection system ODS comprises an illumination source ILS and an optical system which comprises a first lens L1, a second lens L2, a reference grating detector RPD, and a pupil plate PP. The illumination source ILS is typically a laser source that produces a laser beam used to illuminate the wafer grating 10.

The laser beam diffracts at the grating 10 into multiple diffraction orders (diffracted beams). The number of diffraction orders may be dependent on the ratio of the periodicity of the grating structure and the actual wavelength of the laser beam.

The multiple diffracted beams enter into the optical detection system ODS. First, the diffracted beams pass the first lens L1. Next, the diffracted beams impinge on the pupil plate PP. The pupil plate PP is constructed and arranged to redirect the diffracted beams e.g. by a plurality of optical wedges, located on the pupil plate, towards detectors of the RPD. Such redirection may be performed in order to enlarge the spatial distance between the respective beams and to allow measurement of each individual beam by a respective detector. The optical wedges may be positioned at the locations on the pupil plate where each diffracted beam is expected to coincide with the pupil plate PP.

Finally, the diffracted beams are each focused on the reference grating detector RPD by means of the second lens (possibly a compound lens) L2. The reference grating detector RPD detects each of the diffracted beams on a respective dedicated detector. Each detector generates a signal related to the respective diffracted beam.

The laser source may be used to generate two different wavelengths, in which case two different sets of diffracted beams, one set for each wavelength, may be measured.

As mentioned in the foregoing discussion, conventional detection systems are generally arranged to obtain alignment/overlay data from a single signal. The signal may be selected on the basis of a series of experiments done on "short-loop" wafers, which may indicate correlations between the processing steps and the measured signal.

"Short-loop" wafers are wafers which are used for monitoring a single processing operation (or a relatively small number of consecutive processing operation) of a complete semiconductor device manufacturing cycle. In contrast, "full-loop wafers" are exposed to a substantially complete semiconductor device manufacturing cycle. With the series of experiments done on "short-loop" wafers, a measurement of the alignment/overlay may be inferred from the measured signal and the indicated correlation.

In methods and systems according to some embodiments of the present invention, alignment- and overlay-related information may be obtained from markers which are exposed to and/or deformed by one or more processing operations, by analyzing signals measured on full-loop wafers. In essence, the alignment- and overlay-related information may be directly obtained from measurements on "full-loop" wafers. In doing so, the time consumed to process sample wafers and to collect data may drastically be reduced.

Mathematical/statistical modeling of a variance of a measured difference between two signal values may allow one to determine the variance of a single signal value. In other words, for a given plurality of signals, the most stable and probable signal in that plurality can be established. Referring to FIG. 2, which shows a detection system configured to measure multiple diffraction orders from an alignment or overlay marker, the modeling may aim at indicating which diffraction order provides the most stable signal for determining the alignment or overlay quality. For such purpose, the difference between signals related to different diffraction beams or orders (i.e., the order-to-order difference) may be analyzed. It is noted that these signals may be related to (sampled) raw data, but also to filtered or processed signals comprising one or more derived parameters such as a target position.

In an method according to an embodiment of the invention, it may be desirable in the modeling approach to solve the following system of equations:

$$var(r_i - r_j) = var(r_i) + var(r_j) - 2cov(r_i, r_j) \forall i \neq j, \; i, j = 1, \ldots, n \quad \text{(eq. 1)}$$

where n is the number of signals under investigation, and $r_i$, and $r_j$ are values of the n measured signals. $Var(r_j)$ denotes the variance of a signal $r_j$ and $cov(r_i, r_j)$ denotes the covariance of signals $r_i$ and $r_j$. Note that a variance is a positive real number or zero, which can be expressed with the following condition: var(x)≧0. Such a condition may be used when solving the system of equations represented in eq. 1.

With a plurality of n signals, a system of equations as shown in eq. 1 provides $$q = \frac{n!}{2 \times (n-2)!}$$

possible equations.

Eq. 1 can be written in matrix notation:

$$A \cdot \overline{x} = \overline{b} \qquad (eq.\ 2)$$

where A is a matrix of dimensions n×q, and $\overline{x}$ and $\overline{b}$ are vectors of length n and q, respectively.

Vector $\overline{x}$ represents, in a vectorial notation, the set of variances var($r_i$), i=1, . . . , n for all detector signals $r_i$. Vector $\overline{b}$ represents, in a vectorial notation, the set of signal difference variances var($r_i$-$r_j$), i, j=1, . . . , n; i≠j for all detector signals.

In a method according to an embodiment of the invention, it may be desirable to overdetermine the system of equations in order to obtain a solution. In order to do so, it may be desirable that matrix A be a matrix of full-rank.

Such a technique may be especially powerful when applied to multiple signals such as those generated in a detection system as shown in FIG. 2.

In a method according to an embodiment of the invention, the measured alignment signals $r_i$ comprise a first part $r_{is}$, and a second part $r_{ip}$.

$$r_i = r_{is} + r_{ip} \qquad (eq.\ 3)$$

The first part $r_{is}$ may be defined as substantially common to all measured diffraction orders ($r_{is}$=constant ∀i, i=1, . . . , n) and may be due to systematical errors caused by a lithographic projection apparatus (for example, thermal distortion by wafer-heating and/or inaccuracy of pre-alignment).

The second part $r_{ip}$ may correspond to a portion of the signal which, due to processing, is incorrect because of the measurement principles of the detection system. For that reason, $r_{ip}$ may correspond to undetectable errors which are induced by such principles of the measurement.

It should be noted that deformation imposed on the marker by substrate processing may change the relative positions of the diffraction orders. In this respect, it should also be noted that the second part $r_{ip}$ may not relate to a shift of an alignment target as a whole.

Hence, $$var(r_i - r_j) = var(r_{ip} - r_{jp}) \forall i \neq j,\ i, j = 1, \ldots, n \qquad (eq.\ 4).$$

Therefore, in a method according to an embodiment of the invention, it may be assumed that the variance of the difference between two signals is caused by substrate processing and is not associated with issues related to the lithographic projection apparatus.

Referring to FIG. 2 and eqs. 1-4, if all signals from the optical detection system ODS are considered (in this example, seven signals generated at one wavelength) the following set may be found:

$$A \cdot x = b \Longleftrightarrow \begin{bmatrix} 1 & 1 & 0 & 0 & 0 & 0 & 0 \\ 1 & 0 & 1 & 0 & 0 & 0 & 0 \\ 1 & 0 & 0 & 1 & 0 & 0 & 0 \\ 1 & 0 & 0 & 0 & 1 & 0 & 0 \\ 1 & 0 & 0 & 0 & 0 & 1 & 0 \\ 1 & 0 & 0 & 0 & 0 & 0 & 1 \\ 0 & 1 & 1 & 0 & 0 & 0 & 0 \\ 0 & 1 & 0 & 1 & 0 & 0 & 0 \\ 0 & 1 & 0 & 0 & 1 & 0 & 0 \\ 0 & 1 & 0 & 0 & 0 & 1 & 0 \\ 0 & 1 & 0 & 0 & 0 & 0 & 1 \\ 0 & 0 & 1 & 1 & 0 & 0 & 0 \\ 0 & 0 & 1 & 0 & 1 & 0 & 0 \\ 0 & 0 & 1 & 0 & 0 & 1 & 0 \\ 0 & 0 & 1 & 0 & 0 & 0 & 1 \\ 0 & 0 & 0 & 1 & 1 & 0 & 0 \\ 0 & 0 & 0 & 1 & 0 & 1 & 0 \\ 0 & 0 & 0 & 1 & 0 & 0 & 1 \\ 0 & 0 & 0 & 0 & 1 & 1 & 0 \\ 0 & 0 & 0 & 0 & 1 & 0 & 1 \\ 0 & 0 & 0 & 0 & 0 & 1 & 1 \end{bmatrix} \begin{bmatrix} var(r_1) \\ var(r_2) \\ var(r_3) \\ var(r_4) \\ var(r_5) \\ var(r_6) \\ var(r_7) \end{bmatrix} = \begin{bmatrix} var(r_1 - r_2) \\ var(r_1 - r_3) \\ var(r_1 - r_4) \\ var(r_1 - r_5) \\ var(r_1 - r_6) \\ var(r_1 - r_7) \\ var(r_2 - r_3) \\ var(r_2 - r_4) \\ var(r_2 - r_5) \\ var(r_2 - r_6) \\ var(r_2 - r_7) \\ var(r_3 - r_4) \\ var(r_3 - r_5) \\ var(r_3 - r_6) \\ var(r_3 - r_7) \\ var(r_4 - r_5) \\ var(r_4 - r_6) \\ var(r_4 - r_7) \\ var(r_5 - r_6) \\ var(r_5 - r_7) \\ var(r_6 - r_7) \end{bmatrix} \qquad (eq.\ 5)$$

The system as shown in eq. 5 is overdetermined and can be solved by one or more standard techniques, which will be apparent to one of ordinary skill in the art.

In equation 5, it should be noted that the covariance between signals has been assumed negligible in comparison to the variance of each individual signal. However, it should be noted that this assumption may not be valid in particular situations and/or in methods according to other embodiments of the invention. As a result, it may be desirable to verify that assumption after decomposition of the matrix by a suitable analysis, which will be apparent to one of ordinary skill in the art.

Determination of the covariances may be done by computation, but may also be based on, for example, "a best guess" approximation, a brute force calculation, or setting values to zero (or another value) in particular situations and/or in methods according to other embodiments of the invention.

Experimental observations, in the field of alignment/overlay for lithography, have shown that not all order-to-order differences need to be considered in every case. Empirically, it is found that not all signals are (strongly) correlated in at least some cases and therefore it may be possible to neglect some covariance terms.

In addition, it should be noted that knowledge about the marker deformation and the impact of the deformation on the signals generated by that marker can rule out those diffraction orders which do not have a significant covariance. It follows that for those covariance terms, the corresponding terms in the system of equations (e.g. eq. 1) can be set to zero in a method according to an embodiment of the invention.

Moreover, as known to one of ordinary skill in the art, it can be revealed which diffraction order signals can be considered invariant in the system of equations, and thus may be neglected in a procedure to determine a most stable signal.

In a method according to an embodiment of the invention, the system may be extended using significant covariance terms (i.e., correlation between signals $r_i$ and $r_j$), up to a point where the system reaches the underdetermined state and it may no longer be possible to obtain an unambiguous solution. Note that for a full system of equations, comprising all variances and covariances, a solution-vector $\bar{x}$ exists. This solution vector comprises n variances and $$\binom{n}{2}$$

covariances. In such a full system of equations, the number of unknowns is n items larger than the known variables. Thus, it may not be possible to solve the system. Therefore, in order to solve this system of equations, it may be desirable to reduce the number of variables in the system until the system is determined.

After reducing the covariance terms to a plurality of significant (i.e. non-negligible) covariances in the system of equations, the determination of process-induced alignment/overlay errors may strongly be improved.

Equation 6 shows a schematic representation of matrix A (eq. 2) that includes the covariance terms.

As described above, the signal variances $\mathrm{var}(r_{ip})$ can be obtained directly during alignment/overlay measurements by the optical detection system ODS on full-loop wafers. The variances can be used directly in an automated equipment control system for controlling the alignment/overlay accuracy of a lithographic projection apparatus.

Figure 3:
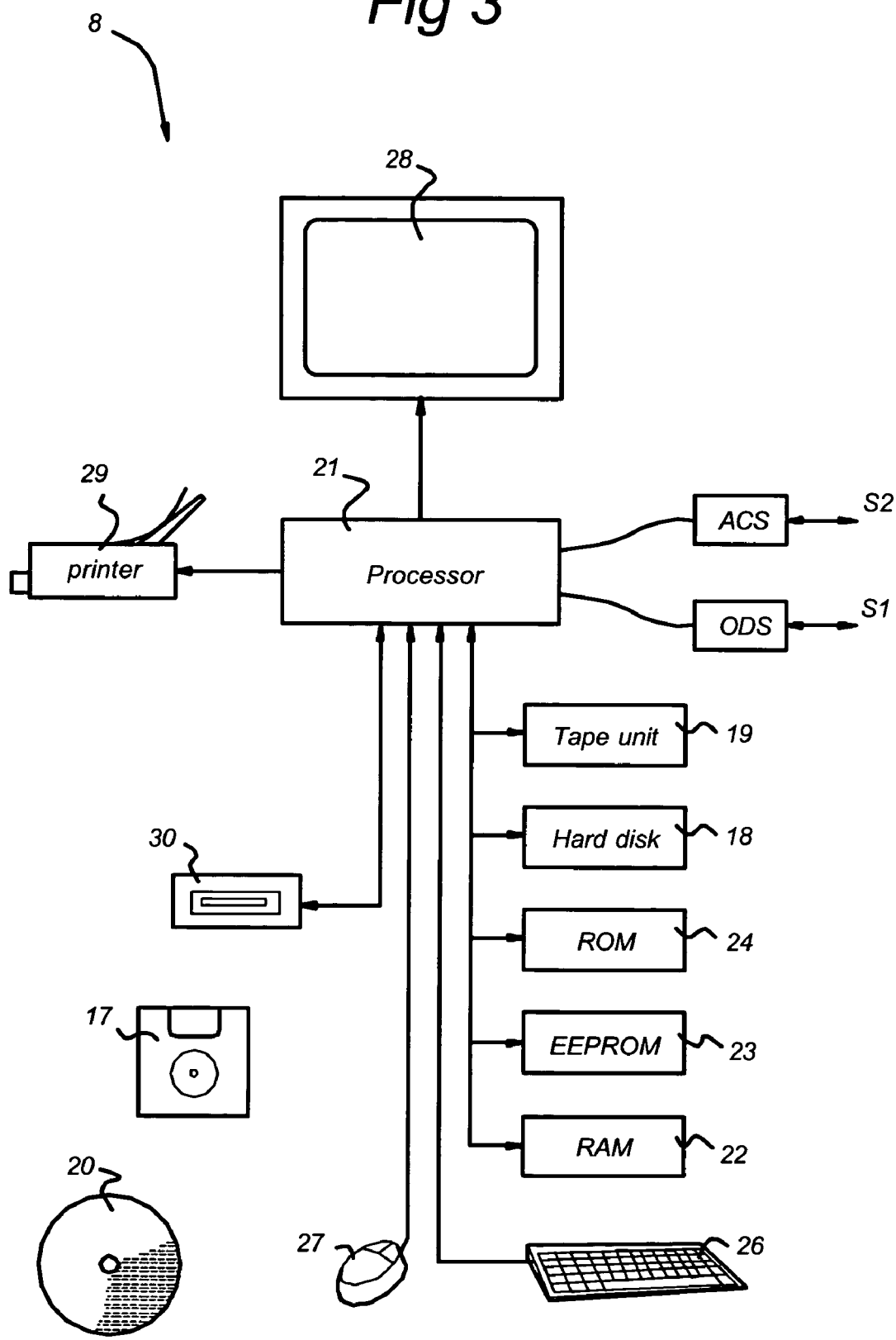
FIG. 3 is a schematic representation of a system according to an embodiment of the invention. Such a system may be configured to perform automated equipment control using a method according to an embodiment of the present invention.

FIG. 3 shows a schematic representation of a computer system that is configured to perform a method of automated equipment control according to an embodiment of the present invention.

Computer system 8 comprises host processor 21 that is coupled to several peripherals. The host processor 21 is connected to one or more memory units 18, 19, 22, 23, and 24, which are configured to store instructions and data, and to one or more reading units 30, which are configured to read different information, e.g., floppy disks 17, CD ROM's or DVD's 20, etc. The host processor 21 is further connected to input devices, keyboard 26 and mouse 27, and to output devices, monitor 28 and printer 29. Other input devices, like a trackball, a touch screen or a scanner, as well as other output devices may also be provided in other embodiments of the invention.

$$A = \begin{bmatrix} 1 & 1 & & & & & -2 & & & & & \\ \vdots & \ddots & & 0 & & & & \ddots & & & & \\ \vdots & & \ddots & & & & & & \ddots & & & \\ \vdots & & & \ddots & & & & & & \ddots & & \\ \vdots & 0 & & \ddots & & & & & & & \ddots & \\ 1 & & & & 1 & & & & & & \ddots & \\ 0 & 1 & 1 & & & & & & & & & \\ \vdots & & \ddots & 0 & & & & & & & & 0 \\ \vdots & & & \ddots & & & & & & & & \\ 0 & 1 & & 0 & & 1 & & & & & & \\ 0 & 1 & & & & 1 & & & & & & \\ & & \vdots & & & & & & & & & \\ & & \vdots & & & 0 & & & & & & \\ & & 1 & 1 & 0 & 0 & & & & & & \\ & & 1 & 0 & 1 & 0 & & & & & & \\ O & & 1 & 0 & 0 & 1 & & & & & & \\ & & 0 & 1 & 1 & 0 & & & & & & \\ & & 0 & 1 & 0 & 1 & & & & & & \\ & & 0 & 0 & 1 & 1 & & & & & & -2 \end{bmatrix} \quad (\text{eq. 6})$$

It follows from the foregoing discussion that the system of equations in which non-negligible covariance terms are included may be considered as overdetermined and, as a result, may allow for the calculation of a solution.

Solving the system of equations allows one to determine vector $\bar{x}$:

$$\bar{x} = \mathrm{var}(r_{ip}),\ i=1,\ldots,n \qquad (\text{eq. 7}).$$

The vector $\bar{x}$ comprises the effects of substrate processing on the alignment/overlay deviations for each of the n (measured) diffraction orders. In the modeling approach described above, the signal $r_i$ having the smallest variance $\mathrm{Var}(r_{ip})$ shows the most stable alignment/overlay performance. In a method according to an embodiment of the invention, the most stable signal $r_i$ is selected to determine the alignment/overlay quality.

In a system or method according to another embodiment of the invention, the computer system 8 may also comprise a network I/O device (not shown) that is configured to enable connection to a network (not shown).

In the embodiment shown in FIG. 2, the memory units comprise RAM 22, (E)EPROM 23, ROM 24, tape unit 19, and hard disk 18. However, it should be understood that additional/other memory units may be provided in other embodiments of the invention, as it will be apparent to one of ordinary skill in the art. In addition, it should also be understood that one or more of these memory units may physically be located remotely from the processor 21, if required.

In a system or method according to an embodiment of the present invention, the processor 21 may comprise several processing units functioning in parallel or controlled by one main processor. These processing units may be located remotely from one another, as will be apparent for one of ordinary skill in the art.

A computer system 8 as shown in FIG. 3 may be constructed and arranged as an automated equipment control system that is configured to perform computations in accordance with a method according to an embodiment of the present invention. The computer system 8 is connected to the optical detection system ODS in order to receive as input the alignment/overlay measurement signals (this input being denoted symbolically by the double ended arrow S1). The computer system 8 may be further connected to the alignment/overlay control system ACS of the lithographic projection apparatus in order to provide an output control signal, based on the variances, to the alignment/overlay control system ACS.

It should be understood that the connection of the computer system to the optical detection system ODS may be carried out in any way known to persons skilled in the art, e.g., by wire, optical fiber, or wireless. It should also be understood that the connection of the computer system to the alignment/overlay control system ACS may be carried out in any way known to persons skilled in the art, e.g. by wire, optical fiber, or wireless, and by a direct connection or by a network connection.

In the embodiment represented in FIG. 3, the alignment/overlay control system ACS is constructed and arranged to receive the output control signal from the computer system 8 and to use the output control signal to control the alignment/overlay accuracy of the mask (MA in FIG. 1) relative to the semiconductor substrate (W in FIG. 1), the interaction of the output control signal being denoted symbolically by the double-ended arrow S2.

It should be noted that, in method or system according to an embodiment of the invention, the computer system 8 may be an integral part of the alignment/overlay control system ACS. In such an embodiment, the functionality of computer system 8 to determine the most stable alignment- and overlay-related signal of the optical detection system ODS may be additionally implemented in system ACS.

In the embodiment of FIG. 3, the processor 21 of computer arrangement 8 may be used to execute a software code. This software code may implement a method according to an embodiment of the present invention and may determine as a primary detector signal, the most stable alignment- and overlay-related signal of the optical detection system ODS.

Figure 4:
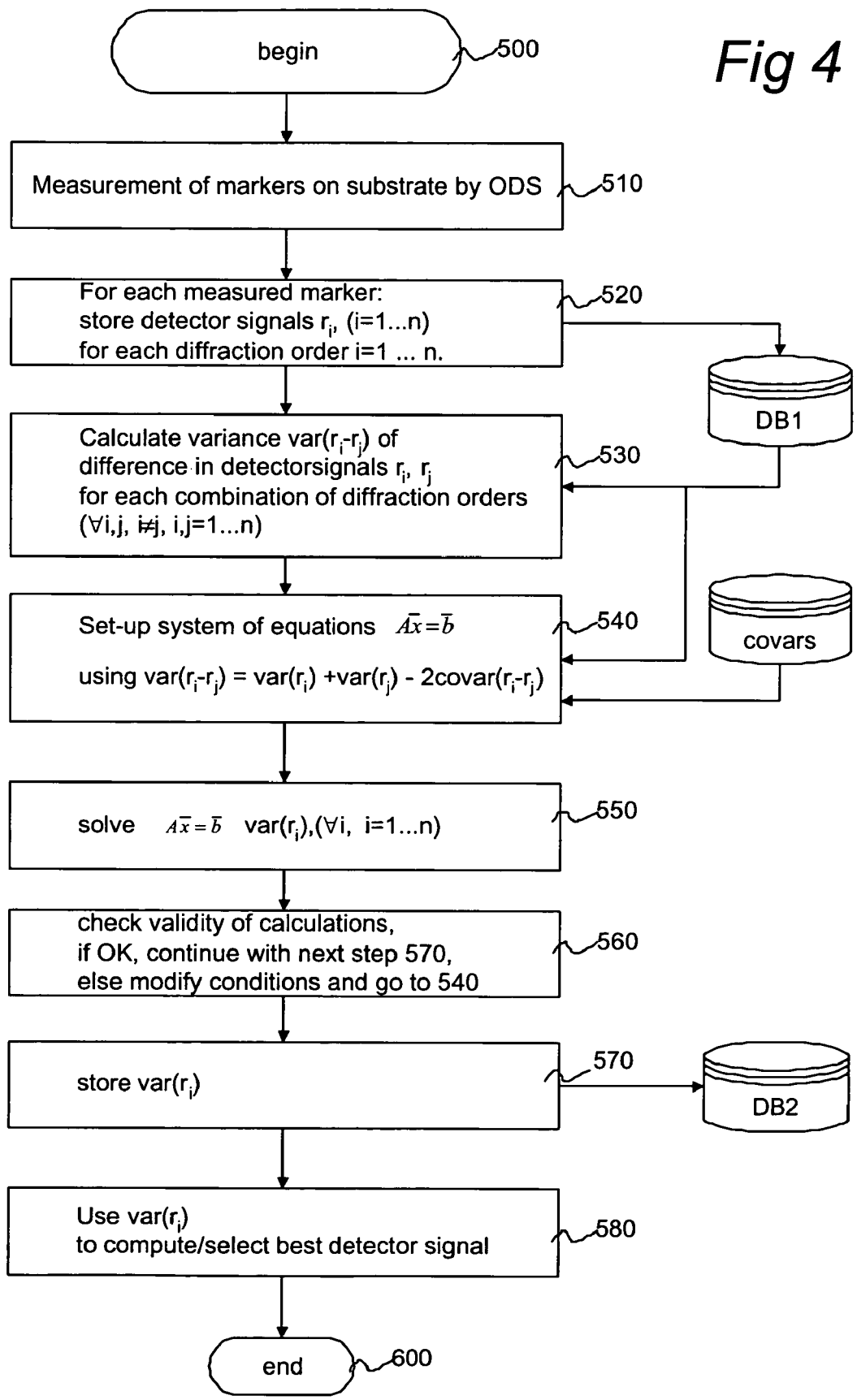
FIG. 4 is a flowchart illustrating a method according to an embodiment of the present invention that may be used, e.g., to obtain a robust and/or stable position value of a reference grating.

FIG. 4 is a flowchart illustrating a method for obtaining the most stable position value of a reference grating in accordance with an embodiment of the present invention. This method, which may be executed by the computer system shown in FIG. 3, starts at task 500.

At task 510 the processor 21 allows execution of the measurement of markers by the optical detection system ODS. In a method according to an embodiment of the invention, the processor 21 may be used to control the measurements performed by the ODS, and/or the receiving of the signals from the ODS. In doing so, progress in measurements performed by the ODS may be monitored.

The measurements by the ODS can be performed in any conceivable way: The ODS may perform measurements in relation to a single marker, a group of markers distributed over the substrate, or a group of markers placed in specific areas of the substrate.

In task 520, the processor 21 obtains the measured detector signals from the ODS. The detector signals $r_i$ may be stored for each measured marker in a first database DB1. The measured detector signals may relate to diffraction orders generated by the marker.

The method then proceeds to task 530, where the processor 21 retrieves the detector signals $r_i$ for each diffraction order i, from first database DB1. Next, the processor 21 calculates the variance $var(r_i-r_j)$ of the difference of the detector signals $r_i$, $r_j$ for each combination of diffraction orders i and j. The definition and calculation of variances can be done in various ways, which will be described below in more detail.

In task 540, the processor 21 sets up a system of equations according to eq.(1) and eq.(2). The processor retrieves values for the respective covariances from the database Covars. Each of the covariance values $cov(r_i, r_j)$ may be set to zero, if no correlation between the respective detector signals $r_i$ and $r_j$ is assumed or observed.

In task 550 the system of equations represented in eq.(1) and eq.(2), is solved with a conventional numerical method. Examples of conventional methods that may be used to solve the system of equations include a Least Squares method or a Singular Value Decomposition method. It should be understood that any other numerical methods that can be used to solve the system of equations may be used in methods according to other embodiments of the invention. The solution comprises a collection of variances $var(r_i)$, one variance $var(r_i)$ for each diffraction order i.

The method then proceeds to task 560, where the validity of the solution $var(r_i)$ is checked. If the validity is confirmed, the solution is submitted for use by the ACS. In case of a non-valid solution, due to an invalid presumption about the conditions of the system of equations to be solved for example, the processor may adapt the conditions for the system of equations. In that case, the processor redirects the procedure to task 540 for a modified calculation of variance values.

After obtaining a valid solution to eq.(2), the procedure proceeds to task 570, where the processor 21 stores $var(r_i)$ as a solution in a second database DB2.

In the following task 580, the processor determines which variance $var(r_i)$ has a relatively minimal value. The detector signal with the minimal variance is regarded as the most stable (and primary) detector signal in a method according to an embodiment of the invention. The processor 21 may then use the primary detector signal in a further procedure as the signal from which, for example, alignment/overlay correction information can be derived, thereby taking into account the obtained $var(r_i)$ of the primary detector signal value. In task 600 the procedure ends.

It should be noted that the definition and calculation of variances in task 530 may relate to calculation of variances for a single wafer (in respect to a plurality of markers on that single wafer), for a batch of wafers, or as a historical average taken at a given instance during the manufacturing cycle (for example, during a specific "front-end-of-line" (FEOL) or "back-end-of-line" BEOL step), running over various wafers or various wafer batches.

In a method according to an embodiment of the invention, the variances may be calculated as a function of the location of the markers on the substrates. It is, for instance, known, that the result of certain processing steps in semiconductor manufacturing may vary with the actual location on the wafer. For example, a dry etching rate or a CMP etching rate may be dependent on the actual location on the wafer. For example, the rate may vary with the location on the radius of the wafer.

In an embodiment as illustrated in FIG. 4, the procedure is performed by an exemplary dedicated processor 21. However, it will be appreciated by one of ordinary skill in the art that the procedure may also be performed by a general purpose processor, which is constructed and arranged to handle various procedures in relation to the control of the lithography processing apparatus. Although not shown in the flowchart illustrated in FIG. 4, it should be noted that the method may proceed to task 590, once the processor determines the most stable signal in task 580. In task 590, the processor sends the alignment/overlay data to the ACS. This task may be considered as a redirection of the data to another procedural task to be performed by the same processor.

In the embodiment represented in FIG. 4, the first database DB1 and second database DB2 are indicated here as separate databases or storage locations. However, these databases may also be part of a single storage location or database within the computer system, in a system or method according to another embodiment of the invention.

It should be noted that the solution as applied to the ACS may comprise a selection of a "best" order signal, which may correspond to the order with the least variance. Also, the selection may determine that one of the colors of the alignment system performs better than another color. Moreover, the selection may indicate that a given sensor of a group of sensors shows less variance than another sensor of that group for its respective (measured) signals. It is further conceivable that a method according to an embodiment of the present invention may be used to select an alignment system from a number of alignment systems. Selection of the alignment system may be based on the determination of the least variance from the respective variance for each system of alignment.

Since the system of equations according to eq. 1 and eq. 2 is overdetermined, i.e., comprises n more unknowns than equations, it may be desirable to manipulate this system of equations to make it determined. This result may be achieved, in a method according to an embodiment of the invention, by reducing the number of unknowns in the system by at least a number n.

In the following discussion, three basic approaches are presented.

A first approach is based on setting all covariance values to certain predetermined values (e.g. zero).

A second approach is based on setting only a reduced number of covariance values to certain predetermined values (e.g., zero). The second approach determines "an educated guess" either based on previous knowledge (experimental data or e.g., assumptions based on theory) related to process-induced variance.

In a third approach the reduction of the number of covariances to a relevant subset of covariances may be based on calibration experiments for a most reliable variance value RV, with all other covariances set to zero.

In a method according to an embodiment of the invention, the most reliable variance RV is determined experimentally, for example, from multiple mark measurements on a limited set of short-loop wafers (using e.g. a method as described above or otherwise known).

FIG. 5 compares variances determined experimentally with variances determined using models having some covariance values set to zero. This figure shows the effect on the variance, when one takes into account the covariances in the selection process for the most robust and stable position value of a semiconductor wafer. In FIG. 5, the variances are determined for a symmetric marker structure using a method according to an embodiment of the present invention.

In a symmetric marker structure (e.g., a block structure consisting of rectangular blocks and intermediate trenches, both trenches and blocks having equal width), there may not be any even diffraction orders. Thus, the covariances between even and odd diffraction orders may be set to zero. In FIG. 5, a comparison of variances is shown for a symmetric marker structure. Variance values are depicted for all diffraction orders (1-7).

Variances determined experimentally with a conventional method (regarded here as most reliable variance values RV, which serve as reference points) are depicted in FIG. 5 by a solid line. Variances determined with all covariances set to zero (i.e., no correlations) are depicted in FIG. 5 by a dashed line. Variances determined under the premise of no correlation between odd and even diffraction orders are shown in FIG. 5 by a dotted line.

As can be seen in FIG. 5, both solutions (no correlations or no odd-even correlations) follow roughly from order to order the variances determined experimentally with a conventional method. In this instance, the computed values and the most reliable values RV determined experimentally do not result in a single least varying diffraction order (this is due to process effects). This result indicates that both assumptions regarding the dependencies of the covariances follow the trend of the experimental data.

Figure 6A:
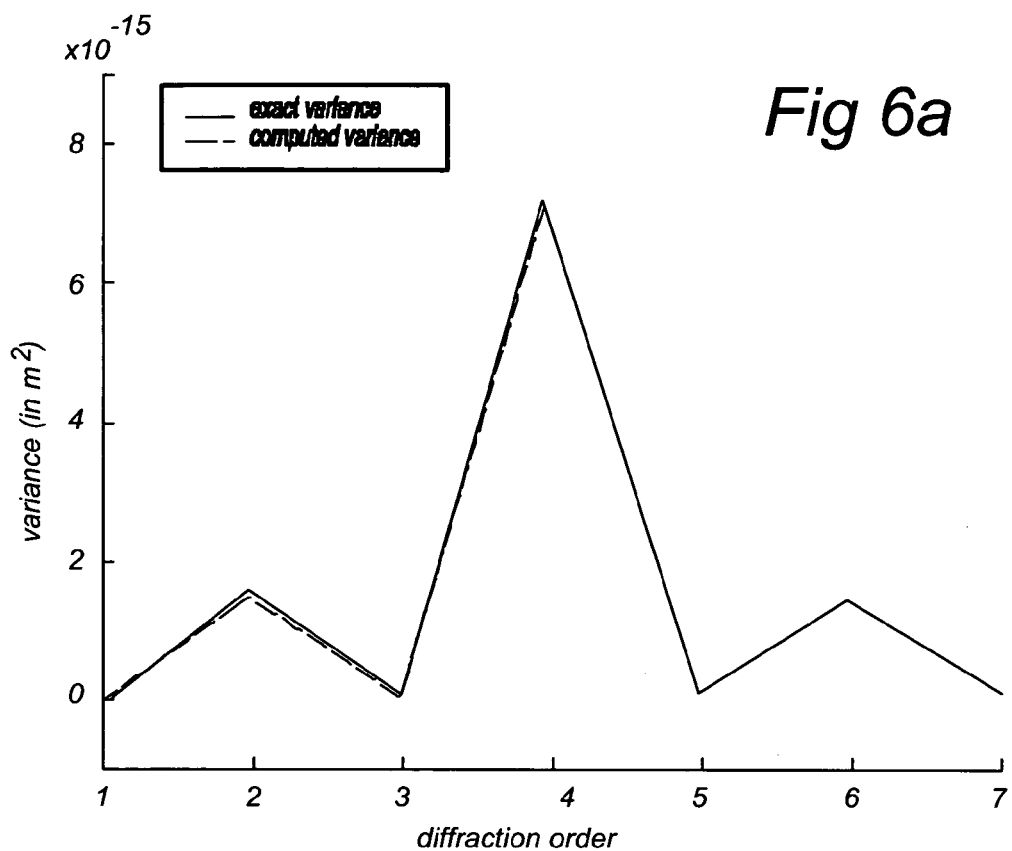
FIGS. 6a and 6b illustrate the effects of taking a limited number of covariances into account using a method according to an embodiment of the present invention, which may be used in a selection process for a most robust and/or stable position value of a semiconductor wafer.
Figure 6B:
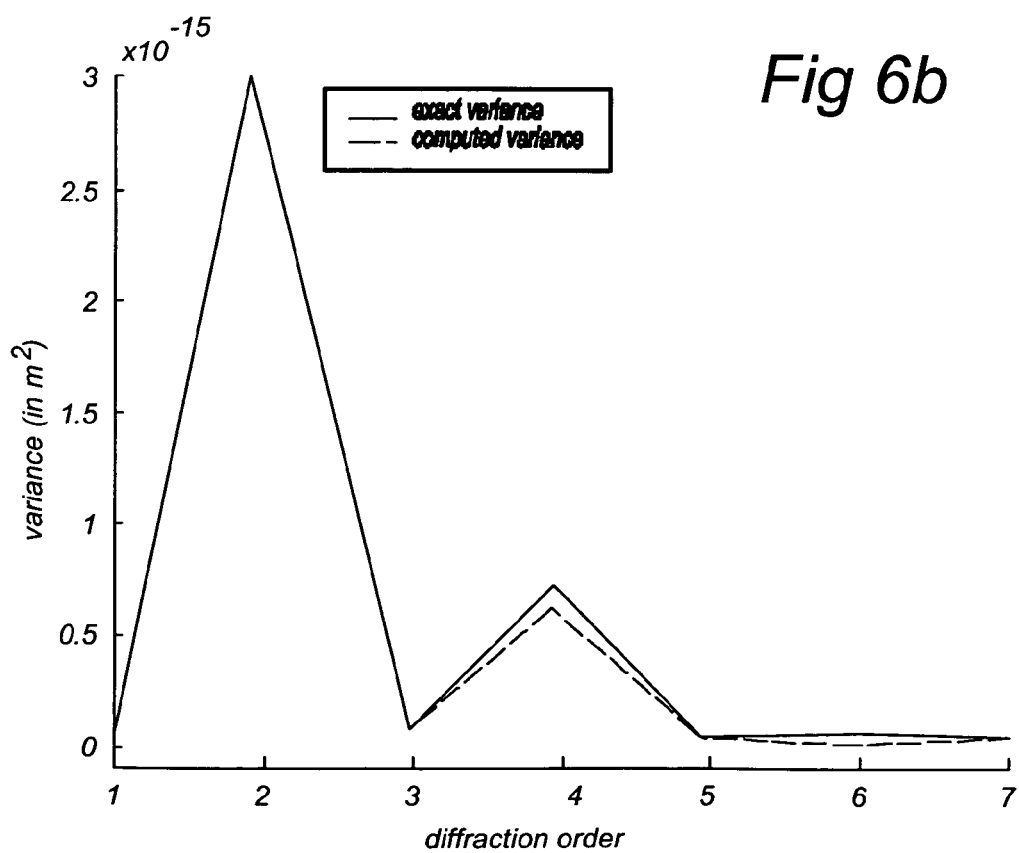

In FIGS. 6a and 6b, computed values of variance and values of variance determined experimentally (the most reliable values of variance RV) are shown for a given marker and a given process. In FIG. 6, the marker comprises a structure oriented in a first (X) direction and a structure oriented in a second (Y) direction, respectively.

The most reliable values of variance RV determined with a conventional method are depicted in FIG. 5 by a solid line. The computed solution $\hat{x}$ of variances determined using production data is shown in FIG. 5 by a dotted line. This computed solution $\hat{x}$ was determined taking a limited number of covariances into account.

In the case of FIG. 6a, the following covariances were set to zero: $\text{cov}(r_1, r_5)$, $\text{cov}(r_2, r_7)$, $\text{cov}(r_3, r_5)$, $\text{cov}(r_3, r_7)$, $\text{cov}(r_4, r_7)$, $\text{cov}(r_5, r_7)$, and $\text{cov}(r_6, r_7)$.

In the case of FIG. 6b, the following covariances were set to zero: $\text{cov}(r_1, r_7)$, $\text{cov}(r_2, r_3)$, $\text{cov}(r_3, r_4)$, $\text{cov}(r_3, r_5)$, $\text{cov}(r_3, r_6)$, $\text{cov}(r_3, r_7)$, and $\text{cov}(r_4, r_6)$.

As can be seen in FIGS. 6a and 6b, the computed solution approximates the most reliable value of variance determined experimentally. The differences between these two curves are not significant. This result indicates equal performance for all orders. The first, third and fifth orders appear to be comparable, and may each be suitable as the most stable diffraction order signal.

From FIGS. 5, 6a and 6b, it can be derived that in some cases a meaningful solution for the system of equations may be obtained if at least n covariances are set to zero.

A difficulty may arise when n covariances are set to zero. Consider, for example, the coefficient matrix A of the system of equations of which the rank is equal to the number of rows, viz.

$$\binom{n}{2}.$$

If n covariances are set to zero, matrix A has n rows with only variances as unknowns. These n rows can make matrix A dependent, which may result in an infinite number of solutions for the system of equations. Therefore, a coefficient matrix A may be required which is full rank (i.e., all columns or rows are independent). For n diffraction orders, a number of $$\left(\binom{n}{2}\atop n\right)$$

possible combinations of covariances set to zero may exist.

To find which covariances are equal to zero, it may be desirable to fulfill the following conditions:
The resulting coefficient matrix has full rank;
It is desirable for the solution to be as close as possible to the exact solution (i.e., closest to the reliable solution determined by a conventional method).

"Closest" may be defined by the Euclidean norm $\|\hat{x}-x\|$, being the difference between the computed solution $\hat{x}$ and the exact solution x. If the value of the Euclidean norm is minimal, then the computed solution $\hat{x}$ may be assumed to be closest to the exact solution x.

Further, from FIGS. 5, 6a and 6b, it can be concluded that diffraction orders may not display an independent behavior, and that some correlations may exist. Given the results shown in FIGS. 5 and 6a, and 6b, it is clear that, in some cases, differences between correlated signals (for various orders) are not significant. This result indicates equal performance for those orders. A selection of a most stable signal can be made from the correlated signals for those orders.

A method according to a further embodiment of the present invention relates to application of a method using wafer (deformation) model parameters as indicators for alignment/overlay correction. Wafer (deformation) model parameters relate to a description of the wafer deformation as a function of position on the wafer. For example, the orientation and position of a wafer may be determined as follows:

A wafer grid is defined for the wafer, relative to a coordinate system of the lithographic projection apparatus. The coordinate system may be defined as an orthogonal system with directions X, Y and Z, which correspond to the coordinate system of the wafer stage of the lithographic projection apparatus. In this orthogonal system, the second direction Y is perpendicular to the first direction X, and the vertical direction Z is perpendicular to both X and Y.

In a method according to an embodiment of the invention, this grid may be defined for each sensor signal measured on a plurality of measuring points across the wafer. In this grid, a first translation Tx in a first direction X, a second translation Ty in a second direction Y, a linear expansion M of the wafer along a direction in the plane of the wafer, and a rotation R around the Z direction, may be defined as wafer model parameters.

In a method according to an embodiment of the invention, the method may operate on one of the wafer model parameters Tx, Ty, M, or R, but it may be effective to use a single performance indicator which relates to the variances of each wafer model parameters Tx, Ty, M, and R in a method according to another embodiment of the invention.

Advantageously, a small set of parameters on the wafer level may provide a characterization which otherwise would require a more comprehensive processing on the level of individual marks (or sets of marks).

In a method according to an embodiment of the invention, a total variance var(total) at the outer edge of a wafer by using a set of wafer model parameters using four parameters (Tx, Ty, M, R) may be defined as follows.

In the x-direction an error δx is made according to:

$$\delta x = \sqrt{var(T_x)} + x \times \sqrt{var(M)} - y \times \sqrt{var(R)} \quad \text{(eq. 8)},$$

and in the y-direction an error δy according to:

$$\delta y = \sqrt{var(T_y)} + y \times \sqrt{var(M)} + x \times \sqrt{var(R)} \quad \text{(eq. 9)},$$

Given that $r_w^2 = x^2 + y^2$, $r_w$ being the radius of the wafer, the maximal error [i.e., var(total)] at the edge of the wafer may be expressed as:

$$var^2(\text{total}) = var^2(T_x) + var^2(T_y) + r_w^2 \times [var^2(M) + var^2(R)] \quad \text{(eq. 10)}$$

For each measured detector (or detector signal, since one detector may provide various signals relating to for example different wavelengths) the total variance var(total) can be established. The detector (signal) having the lowest total variance var(total) value, can be selected as the most stable detector (signal) in accordance with a method according to an embodiment of the present invention.

A method according to one embodiment of the invention comprises a determining task for determining a variance for each of the detector signals from the at least one alignment/overlay feature, and a selection task for selecting one primary detector signal from the detector signals, the primary detector signal having a primary variance value based on a predetermined criterion for evaluation of the variance for each of the detector signals.

A method according to an embodiment of the invention may be used to allow one to obtain more accurate information from the alignment/overlay tool of a lithographic projection apparatus and/or to use this information directly in an automated equipment control of a lithographic projection apparatus. Consequently, the number of time-consuming experiments may be dropped. As a result, use of Design Of Experiments, a well-known statistical method type for optimizing systems with multiple variables, may not be necessary anymore. Alignment and/or overlay errors from processing-related deviations can largely be reduced.

A lithographic apparatus according to an embodiment of the invention is arranged for determining a variance for each of the detector signals from the at least one alignment/overlay feature, and for selecting one primary detector signal from the detector signals, the primary detector signal having a primary variance value based on a predetermined criterion for evaluation of the variance for each of the detector signals.

In a computation system according to an embodiment of the invention, the processing unit is arranged for determining a variance for each of the detector signals from the at least one alignment/overlay feature, and for selecting one primary detector signal from the detector signals, the primary detector signal having a primary variance value based on a predetermined criterion for evaluation of the variance for each of the detector signals.

A computer program product according to an embodiment of the invention, after being loaded (e.g. from a data storage medium such as a disk or semiconductor memory unit) allows the processing unit to carry out determining a variance for each of the detector signals from the at least one alignment/overlay feature, and selecting one primary detector signal from the detector signals, the primary detector signal having a primary variance value based on a predetermined criterion for evaluation of the variance for each of the detector signals.

A data carrier according to an embodiment of the invention includes a computer program product as described above.

While specific embodiments of the invention have been described above, it will be appreciated that the invention as claimed may be practiced otherwise than as described. It is explicitly noted that the description of these embodiments is not intended to limit the invention as claimed.

What is claimed is:

1. A method of position determination, said method comprising:
   obtaining a first set of signals, each signal of the first set corresponding to a respective one of a plurality of portions of light received by a detector, wherein the first set is generated by detection of a first beam of light affected by an alignment feature of a substrate;
   obtaining one or more additional sets of signals such that each signal in the one or more additional sets corresponds to a respective one of the plurality of portions and each set is generated by detection of a respective one or more additional beams of light affected by the alignment feature of the substrate;
   for each portion of light, determining a variance between a corresponding one of the signals in the first set and a corresponding one or more of the signals in the one or more additional sets;
   selecting at least one from among the plurality of portions based on a result of said determining a variance; and
   supplying or making available signals corresponding to the at least one from among the plurality of portions which was selected, for further analysis and processing to determine a position.

2. The method of position determination according to claim 1, wherein said obtaining a first set and one or more additional sets of signals is based on light diffracted by an alignment feature of the substrate, and wherein the plurality of portions comprise a plurality of diffraction orders of light.

3. The method of position determination according to claim 1, said method further comprising determining a position of the alignment feature based on the selected at least one portion.

4. The method of position determination according to claim 1, wherein said selecting comprises selecting one from among the plurality of portions based on a determination that the variance associated with the selected portion is less than the variances associated with the other portions.

5. The method of position determination according to claim 1, said method further comprising determining a correction based on the at least one selected portion, and determining a position of the alignment feature based on the correction.

6. The method of position determination according to claim 1, said method further comprising projecting a patterned beam of radiation onto a target portion of the substrate that is at least partially covered by a radiation-sensitive material.

7. The method of position determination according to claim 1, said method further comprising, subsequent to determining a position of the alignment feature, projecting a patterned beam of radiation onto a target portion of the substrate.

8. The method of position determination according to claim 1, wherein said selecting includes computing differences between the variances.

9. The method of position determination according to claim 1, wherein said selecting includes computing covariances between pairs of the plurality of signals.

10. The method of position determination according to claim 1, wherein said selecting includes evaluating the following equation for at least two different values of i and j:

$$var(r_i-r_j)=var(r_i)+var(r_j)-2cov(r_i,r_j)$$

where $r_i$ and $r_j$ denote values of two of the plurality of signals i and j; var denotes variance; and cov denotes covariance.

11. The method of position determination according to claim 10, wherein said selecting includes solving a system of equations $A\bar{x}=\bar{b}$, where $\bar{x}$ denotes a vector having $var(r_i)$ as coordinates and $\bar{b}$ denotes a vector having $var(r_i-r_j)$ as coordinates.

12. The method of position determination according to claim 11, wherein said selecting includes solving the system using at least one of a least-squares and a singular value decomposition method.

13. The method of position determination according to claim 1, wherein said selecting includes decomposing at least one of the plurality of signals into a constant and a variable part.

14. The method of position determination according to claim 1, wherein said selecting includes correlating a variance of at least one of the plurality of signals with a location of the alignment feature on the substrate.

15. A lithographic projection apparatus comprising:
   an alignment system configured to project an alignment beam onto an alignment feature of a substrate;
   a detection system configured to generate a first set of signals based on detection of a first beam of light affected by the alignment feature, wherein each signal of the first set corresponds to a respective one of a plurality of portions of light from the first beam, said detection system being configured to generate one or more additional sets of signals based on detection of one or more additional beams of light affected by the alignment feature, each of the one or more additional beams corresponding to a respective one of the additional sets, wherein each signal in the one or more additional sets corresponds to a respective one of the plurality of portions; and
   a processor configured to calculate, for each portion of light, a variance between a corresponding one of the signals in the first set and a corresponding one or more of the signals in the one or more additional sets and configured to select at least one from among the plurality of portions based on the calculated variances.

16. The lithographic projection apparatus according to claim 15, said apparatus further comprising a control system configured to position the substrate based on the at least one selected portion.

17. The lithographic projection apparatus according to claim 15, wherein said detection system is configured to generate the first set and the one or more additional sets of signals based on light diffracted by the alignment feature of the substrate and wherein the plurality of portions comprise a plurality of diffraction orders of light.

18. The lithographic projection apparatus according to claim 15, wherein said processor is configured to determine a position of the alignment feature based on the selected at least one portion.

19. The lithographic projection apparatus according to claim 15, wherein said processor is configured to determine a correction based on the at least one selected portion and to determine a position of the alignment feature based on the correction.

20. The lithographic projection apparatus according to claim 15, wherein said processor is configured to compute differences between the variances.

21. The lithographic projection apparatus according to claim 15, wherein said processor is configured to compute covariances between pairs of the plurality of signals.

22. A lithographic projection apparatus according to claim 15, said apparatus further comprising a plurality of memory units electrically coupled to the processor.

23. A lithographic projection apparatus according to claim 15, said apparatus further comprising a network interface configured to connect the processor to a network.

24. A lithographic projection apparatus according to claim 15, said apparatus further comprising a projection system configured to project a patterned beam of radiation onto a target portion of the substrate that is at least partially covered by a radiation-sensitive material.

25. A computer-readable data storage medium including instructions describing a method of position determination, said method comprising:
  obtaining a first set of signals, each signal of the first set corresponding to a respective one of a plurality of portions of light received by a detector, wherein the first set is generated by detection of a first beam of light affected by an alignment feature of a substrate;
  obtaining one or more additional sets of signals such that each signal in the one or more additional sets corresponds to a respective one of the plurality of portions and each set is generated by detection of a respective one or more additional beams of light affected by the alignment feature of the substrate;
  for each portion of light, determining a variance between a corresponding one of the signals in the first set and a corresponding one or more of the signals in the one or more additional sets;
  selecting at least one from among the plurality of portions based on a result of said determining a variance; and
  supplying or making available signals corresponding to the at least one from among the plurality of portions which was selected, for further analysis and processing to determine a position.

26. The computer-readable data storage medium according to claim 25, wherein said obtaining a first set and one or more additional sets of signals is based on light diffracted by the alignment feature of the substrate, and wherein the plurality of portions comprise a plurality of diffraction orders of light.

27. The computer-readable data storage medium according to claim 25, said method further comprising determining a position of the alignment feature based on the selected at least one portion.

28. The computer-readable data storage medium according to claim 25, said method further comprising determining a correction based on the at least one selected portion, and determining a position of the alignment feature based on the correction.

29. The computer-readable data storage medium according to claim 25, wherein said selecting includes computing differences between the variances.

30. The computer-readable data storage medium according to claim 25, wherein said selecting includes computing covariances between pairs of the plurality of signals.

31. A processor configured and arranged to perform a method of position determination, said method comprising:
  obtaining a first set of signals, each signal of the first set corresponding to a respective one of a plurality of portions of light received by a detector, wherein the first set is generated by detection of a first beam of light affected by an alignment feature of a substrate;
  obtaining one or more additional sets of signals such that each signal in the one or more additional sets corresponds to a respective one of the plurality of portions and each set is generated by detection of a respective one or more additional beams of light affected by the alignment feature of the substrate;
  for each portion of light, determining a variance between a corresponding one of the signals in the first set and a corresponding one or more of the signals in the one or more additional sets;
  selecting at least one from among the plurality of portions based on a result of said determining a variance; and
  supplying or making available signals corresponding to the at least one from among the plurality of portions which was selected, for further analysis and processing to determine a position.

* * * * *